United States Patent [19]

Go

[11] Patent Number: 4,983,533

[45] Date of Patent: Jan. 8, 1991

[54] HIGH-DENSITY ELECTRONIC MODULES - PROCESS & PRODUCT

[75] Inventor: Tiong C. Go, El Toro, Calif.

[73] Assignee: Irvine Sensors Corporation, Costa Mesa, Calif.

[21] Appl. No.: 114,415

[22] Filed: Oct. 28, 1987

[51] Int. Cl.$^5$ ............................................... H05K 7/00
[52] U.S. Cl. ............................................ 437/7; 437/8; 437/208; 437/51; 437/915; 357/75; 361/388; 361/389
[58] Field of Search .................. 437/208, 915, 51.8, 437/7; 357/74, 75; 361/388, 389

[56] References Cited

U.S. PATENT DOCUMENTS

| | | | |
|---|---|---|---|
| 3,769,702 | 11/1973 | Scarbrough | 437/208 |
| 4,525,921 | 7/1985 | Carson et al. | 437/208 |
| 4,551,629 | 11/1985 | Carson et al. | 432/208 |
| 4,608,592 | 8/1986 | Miyamoto | 357/74 |
| 4,646,128 | 2/1987 | Carson et al. | 357/74 |
| 4,672,737 | 6/1987 | Carson et al. | 437/208 |
| 4,706,166 | 11/1987 | Go | 352/75 |
| 4,727,410 | 2/1988 | Higgins, III | 357/74 |
| 4,764,846 | 8/1988 | Go | 361/388 |
| 4,794,092 | 12/1988 | Solomon | 437/51 |

FOREIGN PATENT DOCUMENTS 2902002 7/1980 Fed. Rep. of Germany.

Primary Examiner—Olik Chaudhuri
Assistant Examiner—Andrew Griffis
Attorney, Agent, or Firm—Thomas J. Plante

[57] ABSTRACT

A high-density electronic module is disclosed, which is suitable for use as a DRAM, SRAM, ROM, logic unit, arithmetic unit, etc. It is formed by stacking integrated-circuit chips, each of which carries integrated circuitry. The chips are glued together, with their leads along one edge, so that all the leads of the stack are exposed on an access plane. Where heat extraction augmentation is needed, additional interleaved layers are included in the stacks which have high thermal conductivity, and are electrical insulators. These interleaved layers may carry rerouting electrical conductors. Bonding bumps are formed at appropriate points on the access plane. A stack-supporting substrate is provided with suitable circuitry and bonding bumps on its face. A layer of insulation is applied to either the access plane or stack-supporting substrate, preferably the latter. The bonding bumps on the insulation-carrying surface are formed after the insulation has been applied. The substrate face is placed on the access plane of the stack, their bonding bumps are microscopically aligned, and then bonded together under heat and/or pressure.

11 Claims, 5 Drawing Sheets

HIGH-DENSITY ELECTRONIC MODULES - PROCESS & PRODUCT

BACKGROUND OF THE INVENTION

This invention relates to high-density electronic modules, which are intended to meet the apparently insatiable desire for incorporating more electronic capacity in a given space, or reducing the space required for a given amount of electronic capacity.

One of the primary uses of the present invention is to provide memory modules for use in computer apparatus. However, the same concepts may be applied to any field where high-density of electronic circuitry is desired.

To a significant extent, the background of this invention is provided by patented (or applied for) inventions assigned to the assignee of this application. Those inventions relate to the stacking and laminating of multiple chips, or substrates, each carrying integrated circuitry (IC). The stacked chips provide a module having a multiplicity of electrical leads exposed on at least one access plane of the module, the planes in which the chips extend being perpendicular to the access plane.

In U.S. Pat. No. 4,551,629, issued Nov. 5, 1985, the modules of stacked chips are intended to be used in conjunction with photodetectors, which are secured to one access plane of the module, and which comprise a dense array of radiation/electronic transducers.

In U.S. Pat. No. 4,525,921, issued July 2, 1985, similar modules, comprising stacked, circuit-carrying chips, are intended for general use, including the computer memory components mentioned above.

The present invention is intended to solve problems involved in creating easily handled, reliable components for use as computer memories, control logic, arithmetic units, processors, and the like. It also is intended to solve problems resulting from extreme heat dissipation needs created by densely packed electronic chips, particularly where the chip material is an inefficient heat conductor.

Application Ser. No. 856,835, filed Apr. 25, 1986 by the same inventor as the present application, which issued as U.S. Pat. No. 4,706,166 on Nov. 10, 1988 discloses an electronic package comprising a module of stacked (laminated) IC chips which is supported on a stack-supporting substrate, with its access (electrical interconnection) plane resting directly on that substrate. Aligned bonding bumps on the access plane of the stack and on the stack-supporting substrate are integrated to provide a multiplicity of separate electrical conductive paths.

Inadequate heat dissipation is a problem encountered if the stacked chips are not effective thermal conductors and/or if the stacked chips have particularly high power requirements. This problem may not be encountered with stacked silicon chips, but it will occur with stacks of such chips as gallium arsenide (GaAs), silicon-on-sapphire (SOS), or silicon-on-insulator (SOI).

SUMMARY OF THE INVENTION

The present invention uses an "interleaving" concept, in which the three-dimensional stack includes IC chips, alternated with layers of heat-conducting, but electrically non-conducting, material.

The layers between the IC chips may also serve the purpose of carrying connecting conductors which lead from the chip circuitry to circuitry external to the module. This permits both the use of standard chips, and the combination of different types of chips in the same module.

Another feature of the present invention is the structure and method which permit any malfunctioning chip in the stack to be electrically isolated from the electronic package, in order to "repair" an otherwise defective package.

DETAILED DESCRIPTION OF SPECIFIC EMBODIMENTS:

As explained in U.S. Pat. No. 4,706,166, which is herein incorporated by reference to provide more detailed information, it is proposed to stack, or laminate, a number of circuitry-carrying layers 22 to form a stacked module 24; and to mount the integrated stacked module as a unit on a stack-carrying substrate 26. The substrate 26 supports the stacked layers and provides electrical conductors which are interconnected with the layer-carried circuitry. In the package shown in FIGS. 1-4, it is assumed that the stacked layers 22 are silicon chips.

Figure 1:
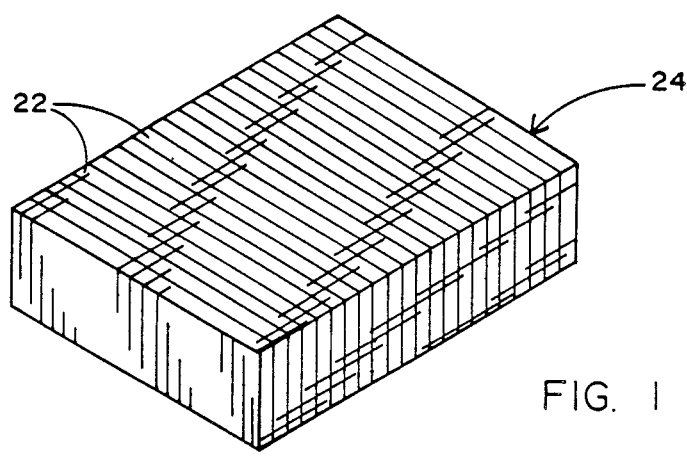
FIG. 1 and 2, which are identical, respectively, to FIGS. 4b and 4b of U.S. Pat. NO. 4,706,166, show isometrically an exploded view of stack of IC chips, and of the electrical conductor metallization and terminals applied to the access plane of the stack.
Figure 2:
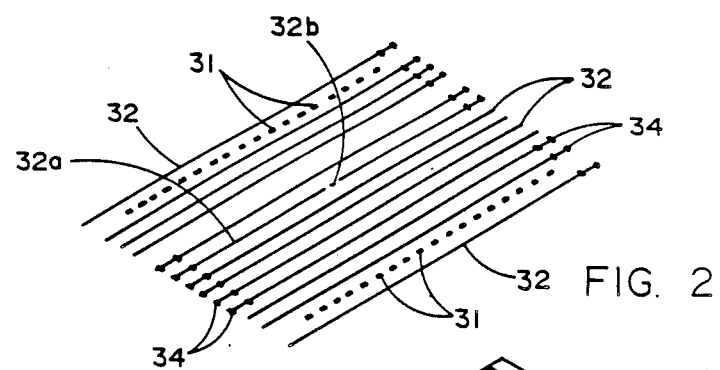
Figure 3:
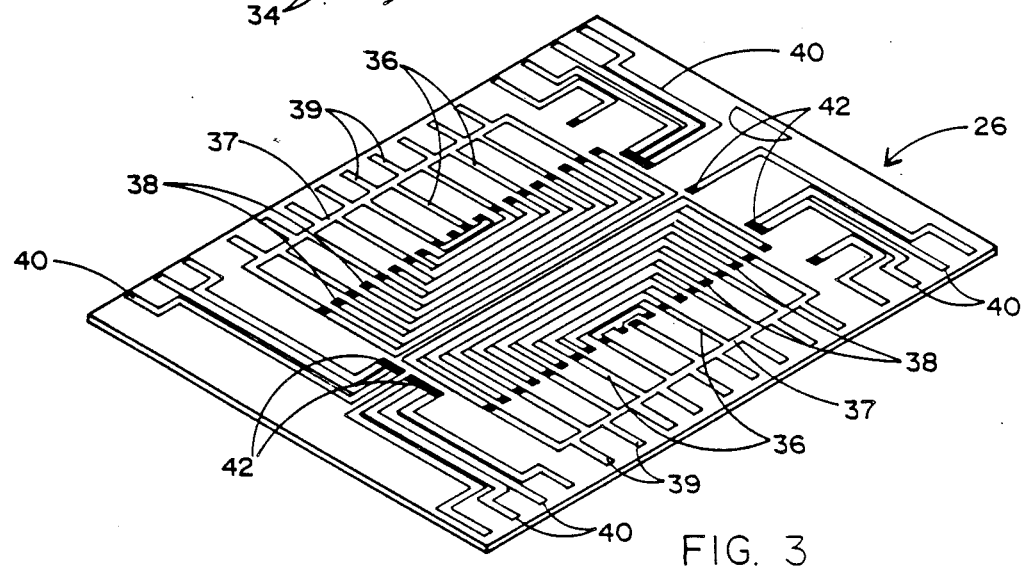
FIG. 3 shows an isometric view of a stack-carrying substrate having terminals to interconnect with the terminals on the stack, and having electrical conductor metallization which includes an interlink conductor and auxiliary conductors which can be individually connected in such a way as to isolate a non-functioning chip.

FIGS. 2 and 3 illustrate the conductors which may be laid on the access plane surface of the stacked chip module 24 and on the stack-carrying substrate 26. A plurality of terminals 31 on the access plane are adapted to be individually bump bonded to matching terminals 38 on the substrate. A number of conducting strips 32 are formed on the access plane, and are provided with terminals 34 which are adapted to be bump bonded to matching terminals on the substrate.

As stated in U.S. Pat. No. 4,706,166, "one of the strips 32, which is designated 32a, has a gap at 32b because the group of chips on one side because the group of chips on one side of the gap have a common row access line, and the group of chips on the other side of the gap have a common row access line, which is not connected to the first group".

The substrate conductors include leads 36 which are connected to pairs of chips by terminals 38. The leads 36 are originally interconnected by a conductor 37, which in turn is connected to a plurality of leads 39 leading toward the opposite edges of the substrate. The substrate also has strips 40, located beyond the ends of stack 24, which have terminals 42 adapted to be bump bonded to the matching terminals 34 on the access plane.

Figure 4:
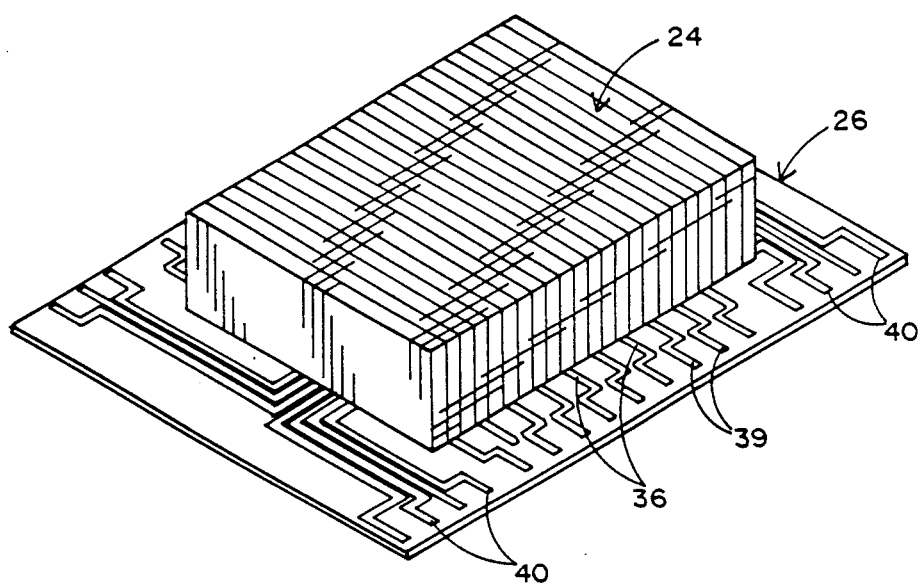
FIG. 4 shows an isometric view of the stack of FIG. 1 secured to the stack-carrying substrate of FIG. 3.

FIGS. 3 and 4 show substrate conductors which are provided for isolation of a defective chip. This permits stack repair after lamination.

In a very high volume production environment, it may not be worthwhile to "repair" a stack if one of the chips becomes defective during the stacking process. However, if reparability is desirable, redundant chips must be included in the stack. In this case the following process may be used:

1. The metallic strips 36 on the substrate 26 (FIG. 3) originally have an interlinking conductor 37 which connects to a reduced number of outlet conductors 39.

2. After a stack has been formed, passivated, and lead cleared, metallic pads are deposited on all the leads to form electrical terminals.

3. Each layer is tested by probing the pads to determine if any of the layers (chips) is defective.

4. If a chip is defective, all the pads and leads on that chip will be removed from the access plane. A programmable YAG laser system, equipped with pattern recognition and interfaced with an automatic prober, is preferred for production applications.

5. The next step is to deposit metallic strips (buslines), and then form the bumps for bump-bonding.

6. After bump-bonding, the interlinking conductor 37 must be cut in such a way that the DI and DO leads from the defective chip will be isolated, while the other leads are separately connected to the conductors 39. (FIG. 4)

The link bar 37 can be made of a fusible alloy There are advantages and disadvantages of fuse-blowing compared to laser cutting, but they will not be discussed here.

Before the facing access plane and stack-carrying substrate can be electrically interconnected by bumpbonding, one of the two surfaces must be covered with passivation (insulation) material, on which only the bumps are exposed. The indium or gold material which constitutes the bumps is preferably deposited after the insulation layer has been formed, or deposited on, the surface.

It is preferable to form the insulation layer on the substrate, because it is much easier to work with. If silicon chips are used in the stack, the substrate is preferably formed of silicon, because it has the same thermal coefficient of expansion as the stack, and it is transparent to infrared radiation. This transparency is helpful during the bump-bonding process. Other infrared or visible transparent substrate materials might be used (e.g., a sapphire substrate will be used in silicon-on-sapphire devices).

FIG. 5-8 show a stacked layer structure which provides augmented heat extraction by including in the stack of IC chips interleaved layers of material having high therma conductivity. The additional layers serve the primary function of heat conduction, and they may also be useful in providing extra real estate for the support of electrical conductors.

Heat dissipation is not usually a serious problem when silicon IC chips are stacked. However, stacks of gallium arsenide (GaAs) IC chips may be used, where much higher operating speed is desired. Since GaAs is a very poor heat conductor, and since it operates at a higher power level than silicon, heat cannot be effectively extracted from a stack of GaAs chips, unless a different stack arrangement is provided.

The present invention uses interleaved layers, which are made of effective heat-conducting material, and which are included in the stack, along with the IC chips.

Figure 5:
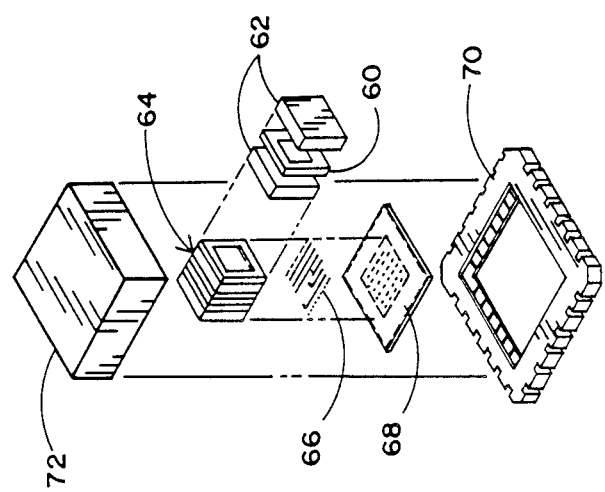
FIG. 5 is an isometric, exploded view of an augmented heat extraction stacked layer package, in which high thermal conductivity layers are interleaved between the stacked IC chips.

FIG. 5 shows the components of a stacked chip package having interleaved heat-conducting layers. A plurality of IC chips 60 are alternated in the stack with a plurality of heat-conductive layers 62. The chips may be composed of silicon, gallium arsenide, or other suitable material. However, as previously stated, need for the interleaved layers 62 is much greater when GaAs (or sapphire substrate) chips are used, because such chips have both high power requirements and low thermal conductivity.

The preferred material for the heat-conducting layers is beryllium oxide (BeO). This material is both an electrical insulator and an excellent heat conductor.

Where both the chips (e.g. gallium arsenide) and the interleaves (e.g. beryllium oxide) are electrical non-conductors, a processing simplification is realized. There is no need for the etching-passivation-lapping steps on the stack, as would be required on a silicon stack (see U.S. Pat. No. 4,525,921).

The IC chips 60 and interleaved layers 62 may not always be alternated. In some situations, a pair of IC chips might provide adjacent layers. In the figures, the thickness of the layers 62 is somewhat exaggerated in proportion to the thickness of the chips 60. In a practical combination each chip 60 might have a thickness of 0.008 inch, and each layer 62 might have a thickness of 0.020 inch. In addition to the interleaved layers, two extra heat-conducting layers are included at one end of the stack, and one such layer at the other end. These added layers provide boundary areas at the stack ends to eliminate thin film processing difficulties that might arise from ending the thin film leads at the edge of the stack. The added end layers also provide area for locating the bus line bump bonds, without interference with the individual signal lines connected to each access plane lead.

After a laminated stack 64 (FIG. 5) has been formed with glue lines between adjacent layers, the stack has interconnect wiring 66 printed on its interconnect (or access) surface; and that surface is supported on, and secured to, a stack-carrying substrate 68. The electrical interconnections between the interconnect plane of the stacked chips and the stack-carrying substrate may be formed by the bump-bonding process described in U.S. Pat. No. 4,706,166. After bump-bonding the bumps on the stack to the bumps on the stack-carrying substrate 68, it is desirable to fill the remaining space between the stack and its supporting substrate with an electrically insulating, thermally conducting epoxy material. This epoxy material provides an additional heat flow path, as well as a strong bond between the stack and the substrate 68.

The stack-carrying substrate 68 may be made of beryllium oxide (BeO) to provide maximum heat conduction. However, BeO is not transparent to infrared; and its use makes aligning of the bumps more difficult. For this reason, silicon may be preferred in some situations as the material for the stack-carrying substrate 68.

Subsequently, the stack-carrying substrate can be mounted on a carrier 70, and enclosed by securing a cover 72 to carrier 70. Preferably, the cover 72 is hermetically sealed to carrier 70 by glass or reflow solder.

Figure 6:
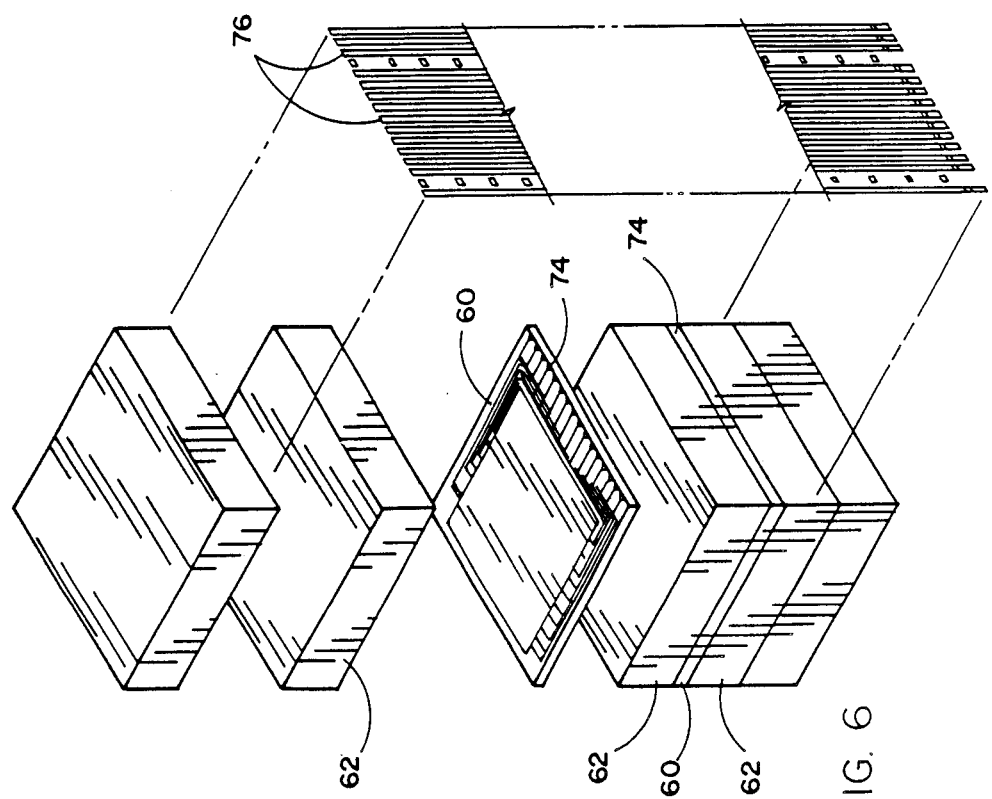
FIG. 6 is an isometric, exploded view of the interleaved stacked chip structure of FIG. 5, in which the electrical terminals on the chips are adapted to be directly connected to the electrical conductors on the stack-supporting substrate.

FIG. 6 shows part of a stack, in which the interleaves 62 function solely as heat transferring members. The electrical leads on each IC chip 60 are brought to the interconnect plane edge 74 of the chip. Metal strips 76 are formed by thin film (or thick film) techniques on the interconnect plane; and suitable electrical connections from the stack-carrying substrate are directly in contact (through terminals and bumps) with leads at the edges of the chips.

Figure 7:
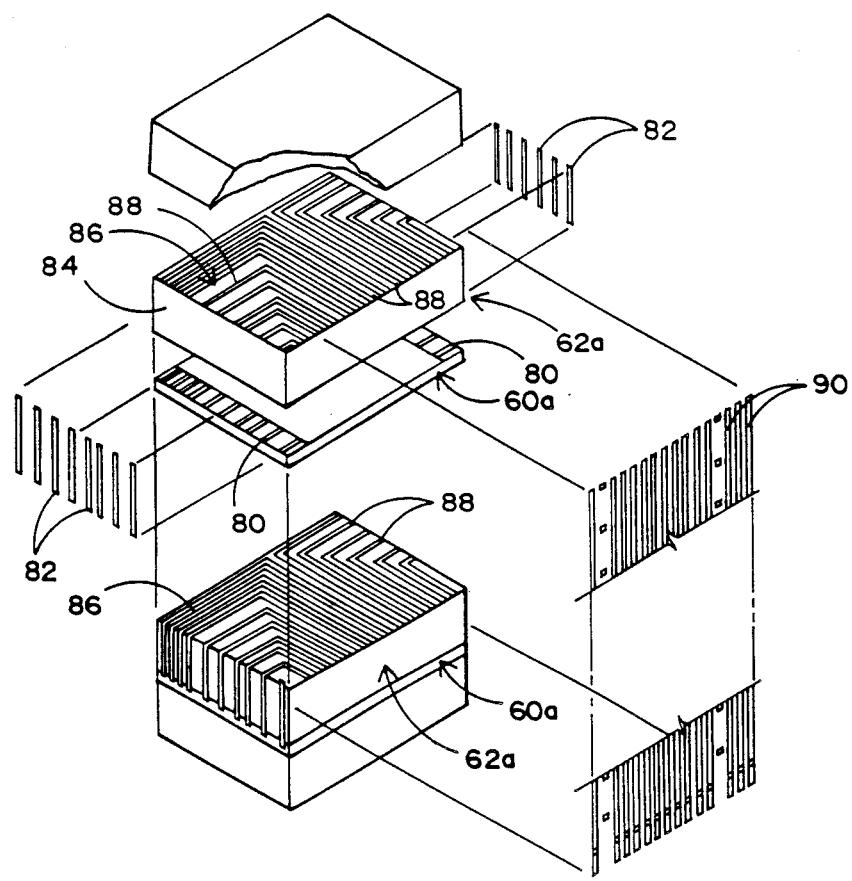
FIG. 7 is an isometric, exploded view of the interleaved stacked chip structure of FIG. 5, in which the surfaces of the interleaved layers carry electrical conductors adapted to connect the electrical terminals on the chips to the electrical conductors on the stack-supporting substrate.

FIG. 7 shows a stacked structure in which the interleaved layer 62a perform the additional function of providing surfaces on which electrical conductors are formed, which conductors extend from terminals on the IC chips 60a to the interconnect plane of the stack. It is the terminals formed at the ends of these conductors which are in electrical contact with terminals formed on the stack-carrying substrate (via bonded bumps).

In the structure of FIG. 7, it is assumed that electrical leads 80 extend to two sides (edges) of each IC chip 60a. Metal strips 82, which are formed on two opposite sides 84 of each layer 62a, make contact with the individual leads 80 on the chips 60a, and carry their respective signals to the flat surface 86 on top of layer 62a. Metal strips 88 (L-shaped) on surface 86 interconnect the respective side strips 82 with leads at the interconnect plane of the stack. These leads are in contact with metal strips 90 formed on the interconnect plane; and their electrical contact with conductors on the stack-supporting substrate is accomplished in the manner described above.

This system of electrical conductors has the capability of re-routing the leads at the edges of the IC chips, and permits a larger number of leads to reach the interconnect plane. In some instances this permits use of IC chips without vendor modification of the normal chip leads. Standard IC chips have leads at two or more sides. Therefore, non-standard chips are required in the modules where all leads on the chips must extend directly to the access (interconnect) plane.

The extensive conductor wiring layouts shown in FIG. 7 require additional, highly precise, process steps. The side conductors 82 are metallization strips which extend across the contacting edges of the leads 80 on the IC chips, and across the contacting edges of the leads at the ends of conductor strips 88 on surface 86. This provides T-shaped connections, which are intended to insure functional electrical contact of the side conductors 82.

Figure 8:
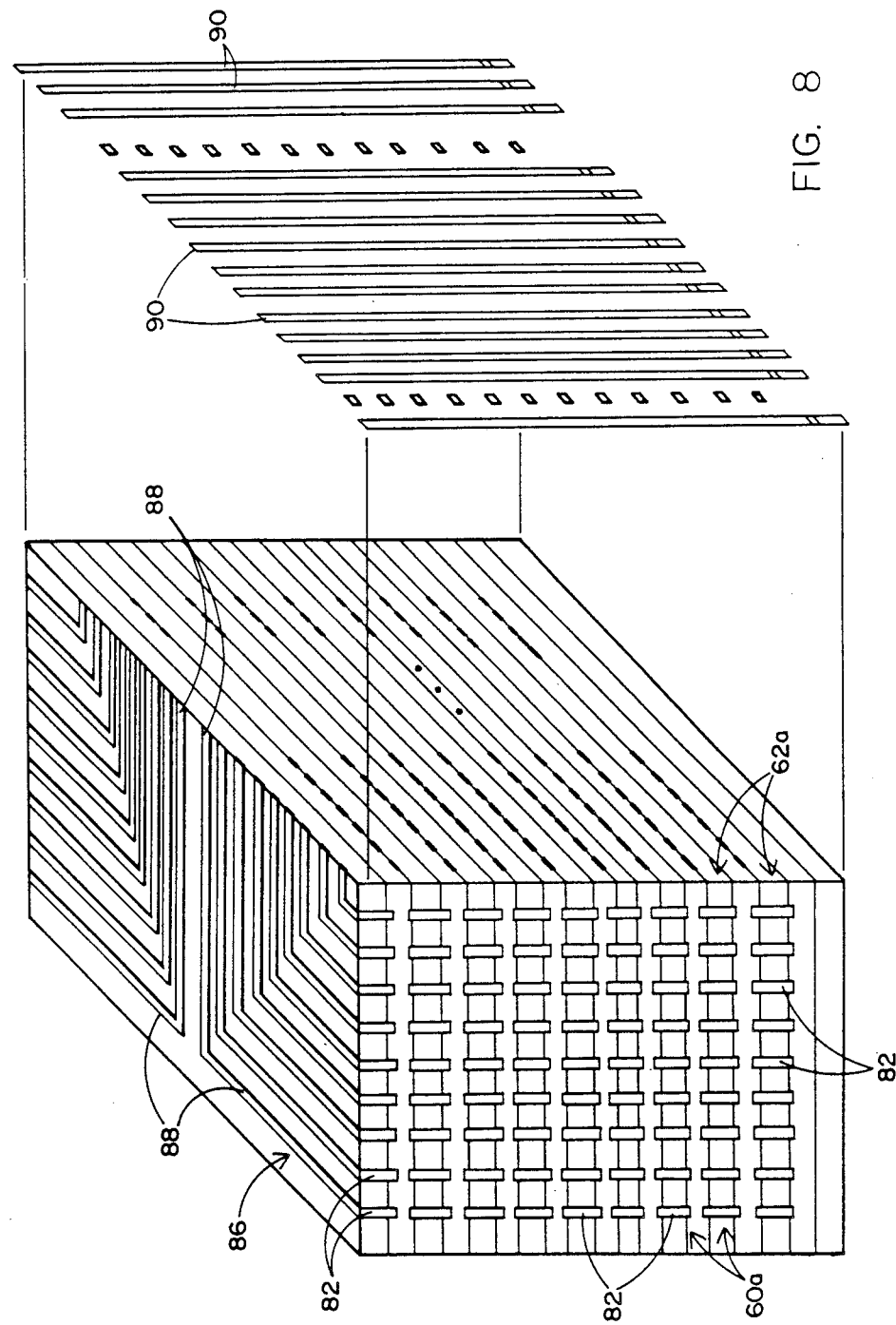
FIG. 8 is an isometric close-up view of a stacked structure of the type shown in FIG. 7.

FIG. 8 is an enlarged view of the stack of FIG. 7, and shows more clearly the layout of the side conductors 82, and the top conductors 88 which bring the IC leads from opposite edges of each IC chip to a single edge of the interleaf, at the access plane.

Re-routing of the leads from the IC chips may also be necessary where a stack of chips includes different types of ICs, i.e., chips which perform different functions. In such a situation, two re-routing methods are possible.

The first is to print connecting metallic lines on the back side of each IC chip to re-route the leads to another plane. This requires front-to-back alignment of the wafer (from which the chip was diced)—a difficult and expensive process. Also, unless all the chips of that particular type used on the same stack need the same re-routing requirement, having the same metal lead patterns on all of them can cause problems in the metallization of the access planes. Another problem is cross-talk between the re-routing lines (on the back of one chip) and the circuitry on the adjacent chip below it.

The second, and preferred, method is to use interleaves as conductor substrates, as described above. Forming of conductors on an interleaf is much easier than forming conductors on the back of a chip. It does not require a front-to-back alignment process. It avoids cross-talk due to proximity of the conductors. Additionally, it is very versatile. Different patterns can be made for a given type of chip which connect it to other chips, without major logistic and cost considerations.

The use of the high thermal conductivity interleaves in a stack of IC chips allows generic packaging technology to accommodate advances in state-of-the-art memory chip density, speed of operation, and increased power dissipation demands, as alternate chip materials with lower thermal conductivity or increased thermal loads are developed. And also, where remetallization of the IC chip leads is impractical, or where different types of IC chips are stacked together, the interleave layers provide a practical method for rerouting of electrical conductors.

From the foregoing description, it will be apparent that the process and product disclosed in this application will provide the significant functional benefits summarized in the introductory portion of the specification.

The following claims are intended not only to cover the specific embodiments disclosed, but also to cover the inventive concepts explained herein with the maximum breadth and comprehensiveness permitted by the prior art.

What is claimed is:

1. A method for fabricating a package containing high density electronic circuitry, comprising:
   providing a plurality of integrated circuit chips, each having a multiplicity of closely-spaced electrical leads at one or more edges thereof;
   interspersing in the stack of integrated circuit chips a plurality of interleaved layers formed of material having high thermal conductivity to extract heat from the stack.
   stacking and bonding the integrated circuit chips and the interleaved layers in a structure having an access plane, on which plane there is a two-dimensional array of closely-spaced electrical leads;
   forming on the access plane, in direct or indirect electrical contact with the chip leads, a plurality of conductive lines and a plurality of conductive terminals;
   providing a stack-carrying substrate adapted to support the stacked chips and having formed thereon a plurality of conductive lines and a plurality of conductive terminals;
   the conductive terminals on the access plane being located in precise matched relationship with the conductive terminals on the stack-carrying substrate; and
   securing the stacked structure to the stack-carrying substrate, with the conductive terminals on the access plane separately contacting the conductive terminals on the substrate.

2. The method of claim 1 in which the integrated circuit chips are gallium arsenide chips.

3. The method of claim 1 in which the material of the interleaved layers is beryllium oxide.

4. The method of claim 1 which also comprises:
   forming on at least some of the interleaved layers electrical conductors which interconnect the leads on the integrated circuit chips with the conductive lines on the access plane.

5. The method of claim 1 in which the leads on the integrated circuit chips connect directly to the conductive lines on the access plane.

6. A method for fabricating a package containing high-density electronic circuitry, comprising:
   providing a plurality of separate layers, at least some of which are IC chips, and at least some of which have electrical conductors terminating at a common interconnect plane;
   stacking and bonding the layers to form an integrated stack having electrical terminals on its interconnect plane
   providing a stack-carrying substrate having printed circuitry thereon including a separate IC chip conductor available for connection to each IC chip, an interlinking conductor interconnecting the IC chip conductors, and a reduced number of conductors leading from the interlinking conductor toward external circuitry;
   securing the integrated stack to the stack-carrying substrate with each IC chip in the stack electrically connected to a separate conductor on the substrate;
   determining whether any stacked IC chip is defective; and
   removing portions of the interlinking conductor on the substrate to isolate the defective IC chip from the external circuitry.

7. A method for fabricating a package containing high density electronic circuitry, comprising:
   providing a plurality of integrated circuit chips, each having a multiplicity of closely-spaced electrical leads at one or more edges thereof;
   interspersing in the stack of integrated circuit chips a plurality of interleaved layers formed of material having high thermal conductivity to extract heat from the stack;
   stacking and bonding the integrated circuit chips and the interleaved layers in a structure having an access plane, on which plane there is a two-dimensional array of closely-spaced electrical leads;
   forming on the access plane, in direct or indirect electrical contact with the chip leads, a plurality of conductive lines;
   providing a stack-carrying substrate adapted to support the stacked chips and having formed thereon a plurality of conductive lines;
   securing the stacked structure to the stack-carrying substrate; and
   providing electrical connections between the conductive lines on the access plane and the conductive lines on the stack-carrying substrate.

8. The method of claim 7 in which the integrated circuit chips are gallium arsenide chips.

9. The method of claim 7 in which the material of the interleaved layers is beryllium oxide.

10. The method of claim 7 which also comprises:
    forming on at least some of the interleaved layers electrical conductors which interconnect the leads on the integrated circuit chips with the conductive lines on the access plane.

11. The method of claim 7 in which the leads on the integrated circuit chips connect directly to the conductive lines on the access plane.

* * * * *